United States Patent [19]

Shrimali et al.

[11] Patent Number: 4,920,404
[45] Date of Patent: Apr. 24, 1990

[54] LOW STRESS LIGHT-EMITTING DIODE MOUNTING PACKAGE

[75] Inventors: Dinesh C. Shrimali, San Ramon; Frank M. Steranka, San Jose; Cheryl L. McLeod, Mountain View, all of Calif.

[73] Assignee: Hewlett-Packard Company, Palo Alto, Calif.

[21] Appl. No.: 351,194

[22] Filed: May 12, 1989

[51] Int. Cl.$^5$ .................... H01L 23/28; H01L 33/00
[52] U.S. Cl. .................................. 357/72; 357/17; 357/70; 357/68; 174/52.2
[58] Field of Search ............... 357/17, 72, 70, 55; 174/52.2; 437/224, 209

[56] References Cited

U.S. PATENT DOCUMENTS

| | | | |
|---|---|---|---|
| 3,676,668 | 7/1972 | Collins et al. | 240/130 |
| 3,914,786 | 10/1975 | Grossi | 357/68 |
| 4,267,559 | 5/1981 | Johnson et al. | 357/81 |

FOREIGN PATENT DOCUMENTS

| | | | |
|---|---|---|---|
| 52-70783 | 6/1977 | Japan | 357/17 |
| 56-142657 | 11/1981 | Japan | 357/17 |
| 60-74486 | 4/1985 | Japan | 357/17 |
| 61-207085 | 9/1986 | Japan | 357/17 |
| 8714527 | 1/1989 | United Kingdom | 357/17 |

Primary Examiner—Martin H. Edlow
Assistant Examiner—Donald L. Monin
Attorney, Agent, or Firm—Patrick J. Barrett

[57] ABSTRACT

A light-emitting diode is mounted in the bottom of a cavity in a metal lead and the assembly is potted in a transparent plastic material. The walls of the cavity surround the sides of the light-emitting diode in sufficiently close proximity to effectively shield the light-emitting diode from thermal expansion stresses from the plastic potting material which would induce light output degradation. Such a cavity may be a right-circular cylinder with a diameter less than 75 micrometers greater than the largest transverse dimension of the light-emitting diode. The front face of the light-emitting diode may be flush or beneath the face of the metal lead for minimizing stress. The cavity may be deep enough that the front face of the light-emitting diode is closer to the bottom of the cavity than to its open end. The front face may protrude beyond the open end of the cavity and be surrounded by a reflective surface. The edges of the front face of the light-emitting diode may be beveled for minimizing stress.

30 Claims, 2 Drawing Sheets

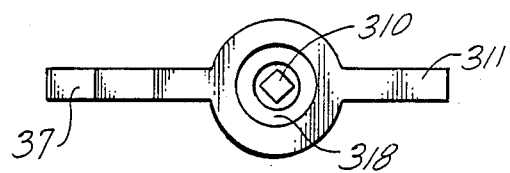
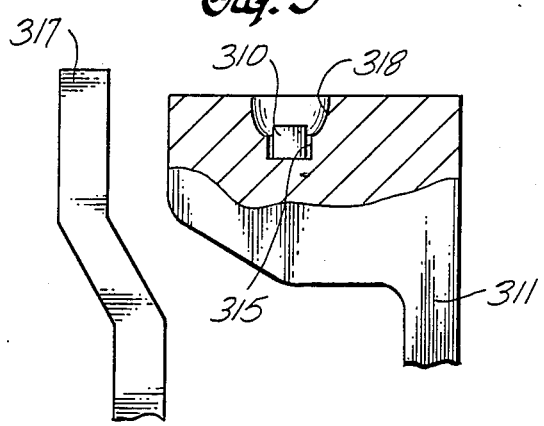
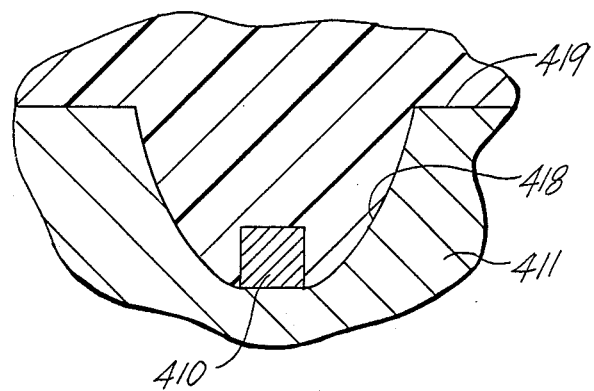

LOW STRESS LIGHT-EMITTING DIODE MOUNTING PACKAGE

FIELD OF THE INVENTION

This invention relates to mounting of light-emitting diodes for minimizing stress on such diodes when potted in transparent plastic material.

BACKGROUND OF THE INVENTION

In recent years the light-emitting diode (LED) has become a commonplace device for a broad range of applications. In the visible range it may provide communication between an electronic device and the user. In the infrared and visible ranges it may have broad applications for communications. A LED may be used in an optical isolator for decoupling an input signal from an output. It may be used as a light source in xerographic type printers. In many such applications it is an important desideratum that the LED maintains a relatively high light output which is not degraded by external influences.

In many applications of LEDs, the LED is imbedded in a transparent plastic potting material such as an epoxy resin or the like. This may be done to protect the LED from an external environment, however, in many applications the transparent material is employed to better match the relatively high index of refraction of the semiconductor material forming the LED, and thereby enhance the amount of light extracted from the LED.

It has been found, however, that under some conditions the light output of a LED may be significantly degraded due to stresses on the LED exerted by the plastic potting material. LEDs made of AlGaAs are particularly susceptible to light output degradation from such external causes. This material is stress sensitive and a permanent degradation in light output may occur in some LEDs when operated while a mechanical stress is applied.

An epoxy potting material is typically molded at temperatures of 100° C. or more. The resin thus cured becomes rigid and may exert large stresses on the LED chip when cooled to room temperature or below. An exemplary plastic potting material may have a coefficient of thermal expansion in the order of 90 to 100 ppm/°C. An exemplary semiconductor chip may have a coefficient of thermal expansion of only about 7 to 8 ppm/°C., or more than an order of magnitude less than the potting material. The metal lead on which the LED is mounted has a coefficient of thermal expansion somewhere between such materials, and typically much closer to the thermal expansion of the LED chip. For example, when copper is used for the lead, it has a thermal expansion of 16.5 ppm/°C. around room temperature.

Because of such differences in coefficient of thermal expansion, the plastic material may exert a high stress on the LED, particularly when operated at low temperature. Thus, for example, LEDs may be tested at −30° C. for some applications or as low as −55° C. for military applications. Under such conditions, some LEDs may exhibit quite substantial permanent degradation of light output.

The stress level on the LED chips may be reduced by making the chips very thin. This moves the light emitting region close to the metal lead, the thermal expansion coefficient of which is much closer to that of the LED material than that of the potting material. LED chips may be made thinner than 100 micrometers, however, these are quite difficult to handle in high volume manufacturing. As an alternative, rather large area LED chips may be used to reduce the absolute stress level and improve degradation performance. This however, significantly increases the cost of the LED chips since the yield per wafer is concomitantly reduced.

Thus, it is desirable to provide a means for reducing stress level on a LED for minimizing light degradation due to thermally imposed stress.

Thus, in practice of this invention the led on which the LED chip is mounted is formed with a cavity in which the LED chip is mounted. The cavity is only slightly larger in area than the chip for effectively shielding the LED from thermal expansion (or contraction) stresses applied by the plastic potting material. This dramatically improves the light output performance of the LED without the complications caused by thin chips or the cost of large area chips. Improvement from 60% of the LED chips showing severe light output degradation to none with such degradation are readily achieved.

This invention significantly reduces mechanical and thermal stresses on the LEDs since the thermal expansion mismatch is greatly reduced by bringing the light emitting junction very close to the metal lead. When the LED is largely buried in the cavity it is isolated from most of the encapsulating plastic potting material, resulting in significant reduction of stresses. The LED may be in a tight cavity, or a deep cavity for shielding the LED from thermal expansion stress.

LEDs have previously been placed in recesses in metal leads for a very different purpose and even in such embodiments thermal stresses may degrade light output. The recesses referred to are employed for maximizing the light effectively extracted from the LED. The walls of the recess are in the form of a cone or generally parabolic surface around the LED so that light emitted from the sides of a transparent LED is reflected by the walls of the recess in a direction more or less perpendicular to the front face of the LED.

When such reflective recesses are filled with plastic molding material, thermal stress may still be sufficient to cause light output degradation. A reason for this is that the recesses ar large diameter and shallow relative to the dimensions of the LED, so that a LED may be placed in the recess reliably by automated manufacturing equipment. Such large and shallow reflective recesses have not avoided light output degradation.

For example, a LED chip in a recess having the same depth as the height or thickness of the LED chip and a diameter at the open end of 1.27 millimeters, showed thermal stress induced light output degradation as poor as when the chip was mounted on a flat metal surface. An approximate stress analysis showed that shear stress exerted on the chip by the plastic molding material was reduced to about 60% of the stress exerted when the chip was mounted on a flat metal plate. Regardless, essentially all such LEDs showed light output degradation when operated at low temperature.

Examples of such recesses are seen in U.S. Pat. Nos. 3,764,862 by Jankowski; 3,863,075 by Ironmonger, et al.; and 3,914,786 by Grossi.

BRIEF SUMMARY OF THE INVENTION

There is therefore provided in practice of this invention according to a presently preferred embodiment a metal lead with a light-emitting diode mounted on the lead and a transparent plastic potting material surrounding the lead and light-emitting diode. A cavity is formed in the lead with a wall surrounding the sides of the light-emitting diode in sufficiently close proximity to the sides for effectively shielding the light-emitting diode from thermal expansion stresses applied by the plastic potting material.

In a preferred embodiment, at least a major portion of the light-emitting diode is below the open end of the cavity and the walls of the cavity are substantially parallel to the sides of a light-emitting diode. In an exemplary embodiment, the light-emitting diode is square and the cavity is in the form of a cylinder with a diameter less than 75 micrometers greater than the diagonal of the light-emitting diode. A light-emitting diode may also be mounted in a deep cavity for shielding it from thermal expansion stresses.

DESCRIPTION OF THE DRAWINGS

These and other features and advantages of the present invention will be appreciated as the same becomes better understood by reference to the following detailed description when considered in connection with the accompanying drawings, wherein:

FIG. 5 is a side view partially in cross-section of still another embodiment of light-emitting diode mounting;

FIG. 6 is a view of the front face of the mounting illustrated in FIG. 5; and

FIG. 7 is a fragmentary transverse cross-section of yet another embodiment of light-emitting diode mounting.

DETAILED DESCRIPTION

Figure 1:
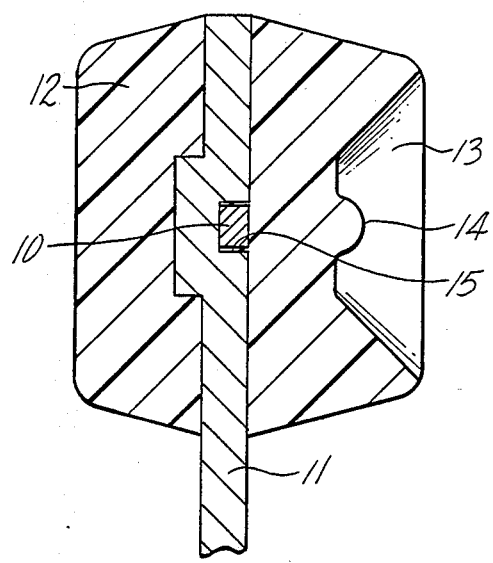
FIG. 1 is a transverse cross-section of light-emitting diode mounting constructed according to principles of this invention.
Figure 2:
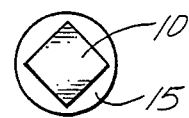
FIG. 2 is a face view of a fragment of the mounting of FIG. 1.

An exemplary mounting for a light-emitting diode (LED) 10 comprises a conventional metal lead 11 which may be made from silver or gold plated copper, steel plated with copper and gold or silver, or the like. In the illustrated embodiment, the portion of the lead on which the LED is mounted is completely embedded in a transparent plastic potting material 12 which may, for example, be an epoxy resin cured in a conventional manner. The materials, manufacturing techniques and the like are conventional.

One face of the plastic potting material in this embodiment comprises a recess 13, a center portion of which has a convex surface 14 to serve as a lens for tending to collimate light from the front face of the LED.

In this embodiment, the lead is stamped or coined to produce a cavity 15 which is substantially cylindrical. The side wall of the cavity is substantially perpendicular to the face of the lead and to the flat bottom of the cavity to which the LED is secured by a conventional electrically conductive die mounting cement (not separately shown although it may be from 10 to 25 micrometers thick).

A slight draft may be included on the walls of the cavity so that the punch that forms the cavity may be withdrawn. Otherwise the walls of the cavity are substantially parallel to the side faces of the LED. It will be noted that parallel is used in the sense that the wall of the cavity is parallel to the side face of the LED in the direction of the depth of the cavity. Clearly the walls are not parallel in other directions when the LED chip is square and the wall of the cavity is cylindrical.

The diameter of the cavity is only slightly larger than the diagonal of the square LED in the cavity. Thus, for example, the diameter of the cavity may be 406 micrometers to accept a LED chip which is 267 micrometers square, i.e., with a diagonal of 377 micrometers. The depth of the cavity is such that the front face of the LED is substantially flush with the face of the lead at the open end of the cavity. Thus, for example, if the LED has a thickness of 300 micrometers, the cavity is also 300 micrometers deep, subject to customary manufacturing tolerances. The front face may actually be ever so slightly above or below the face of the lead, but is essentially flush therewith.

By fitting the LED tightly into the cavity, the metal walls surrounding the sides of the LED effectively shield the LED from thermal expansion stresses applied by the plastic potting material. There is plastic between the sides of the LED and the wall of the cavity, however, the thickness is insufficient to apply light degrading stresses on the LED due to thermal expansion. The reason for this is that most of the thermal expansion (or contraction) surrounding the LED is governed by the thermal expansion coefficient of the metal rather than the thin layer of plastic between the metal and LED. Thermal stresses exerted on the LED are therefore minimized.

With some epoxy resins and LED chips which are not shielded by a cavity as provided in practice of this invention, essentially 100% of the chips demonstrate significant light output degradation when operated at low temperature. It has been found that by employing an epoxy resin with a relatively lower than usual modulus of elasticity, the proportion of LEDs showing significant light output degradation can be reduced to about 60%. Clearly this remains as an exceptionally high proportion of damaged chips. What this indicates is that the stress levels are near the threshold where severe light output degradation occurs, and some LEDs are just above the threshold and some are just below it.

It is found that such light output degrading stresses are avoided in practice of this invention by mounting a LED in a metal cavity which shields the LED from the thermal expansion stresses exerted by the plastic potting material.

It appears that light output degrading stresses may be avoided in essentially all LEDs where the diameter of the cavity is less than 75 micrometers greater than the largest transverse dimension of the LED. Preferably, the LED is square and the diameter of the cavity is less than 75 micrometers greater than the diagonal of the LED. This appears to assure that light-output degrading stresses are avoided.

If desired, the walls of the cavity may be provided with a small taper to aid entrance of the chip into the cavity during automatic assembly operations. In such an embodiment, the diameter of the bottom of the cavity may be 25 micrometers or so larger than the diagonal of the LED chip, while the diameter of the cavity at its open end is 75 micrometers or so larger than the diagonal of the chip.

The distance between the wall of the cavity and the LED chip within the cavity to provide sufficient shielding for avoiding light output degradation is to some extent dependent on the chip size. A relatively larger spacing is found to be acceptable for larger chips.

Thus, for example, acceptable results are obtained with a 216 micrometer square chip in a cylindrical cavity with a diameter of 380 micrometers. That is, the diameter of the cavity is about 75 micrometers larger than the diagonal of the LED chip.

Acceptable results are also obtained with a 420 micrometer square LED chip in a cavity, the open end of which has a diameter of 735 micrometers. The cavity in this embodiment was not completely cylindrical, although the walls approached a cylindrical shape near the open end. Nearer the bottom of the cavity the walls curved inwardly to form a concave reflector around the LED. Thus, although the clearance at the front face of the chip between the diameter of the cavity and the diagonal of the chip was about 145 micrometers, the "average" clearance was somewhat less. Even the average clearance was, however, somewhat larger than 75 micrometers. It was also shown, however, that a chip about 395 micrometers square in a 735 micrometer diameter cavity did not consistently avoid light output degradation.

As suggested above, it is desirable to employ a plastic potting material with a relatively low coefficient of thermal expansion to maximize the spacing between the LED chip and wall of the cavity within which satisfactory results may be obtained. A number of epoxy resins appear satisfactory, including OS-3100 obtained from Hysol Division of Dexter Electronic Materials, Industry, Calif., and resin/hardener combinations ME51/HV512, XN2270-1/XV2271-1; and XN2372/XV2373, all available from the Japanese company Nippon Pelnox.

Figure 3:
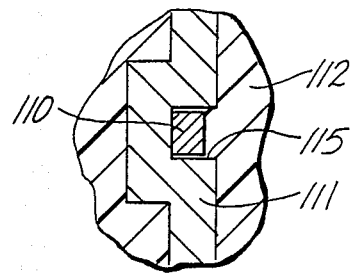
FIG. 3 is a fragmentary transverse cross-section of another embodiment of light-emitting diode mounting.

It may be desirable when the diameter of the cavity is relatively large as compared with the diagonal of the LED, to recess the front face of the LED below the face of the lead to which it is attached by making a deeper cavity. Thus, as illustrated in FIG. 3, a metal lead 111 has a cylindrical cavity 115 in which a LED 110 is mounted. The cavity is 250 micrometers deeper than the thickness of the LED so that the front face of the LED is recessed from the face of the lead by about 250 micrometers. As pointed out hereinafter, recessing the LED chip with its front face below the face of the lead at the open end of the cavity is desirable for shielding the LED from thermal stresses exerted by plastic outside the cavity.

It is sometimes desirable to extract light from side faces of a LED as well as the front face. Little of such light could be utilized where the LED is completely recessed in a substantially cylindrical cavity. An alternative arrangement is illustrated in the fragmentary cross-section of FIG. 4.

The p-n junction from which light is emitted in many LEDs is within 50 micrometers or less of the front face of the LED. The amount of light extracted may be enhanced by mounting a LED 210 in a cavity 215 in a metal lead 211 so that the front face of the LED protrudes from the open end of the cavity a distance up to about 250 micrometers above the face of the lead. In such an embodiment the light-emitting junction near the front face of the metal lead and most of the thermal stress applied at the elevation of the junction is exerted by the thermal expansion (or contraction) of the metal lead rather than the plastic 212 in which the assembly is encapsulated.

Figure 4:
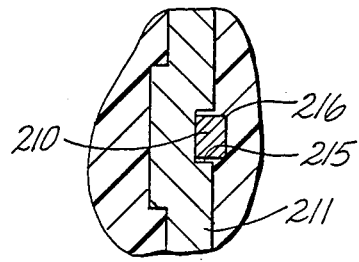
FIG. 4 is a fragmentary transverse cross-section of yet another embodiment of light-emitting diode mounting.

The thermal stress exerted on the LED may be further reduced by forming a slight bevel 216 along the edges of the LED between the side faces and front face. The height of the bevel is typically about 50 micrometers. The most significant stresses are applied to the LED at the edges remote from the lead. By beveling the edges as illustrated in FIG. 4, significant reductions in stress in the LED may be obtained. It is found that beveling is also advantageous when the LEDs are mounted substantially flush with the surface of the lead.

Such a bevel may be formed in the process of separating individual LEDs from the wafer on which they are made. One conventional technique for separating LEDs is to saw or "dice" the wafer of semiconductor with an orthogonal array of saw cuts. Instead of using a planar dicing saw to separate the LEDs, one may dress the face of the dicing saw to simultaneously cut a shallow V-shaped groove in the face of the wafer and slice the rest of the way through the wafer with a flat portion of the dicing saw. The sides of the V-shaped groove form the bevels on the resultant LEDs.

Alternatively, the V-shaped grooves may be formed in the face of the wafer, which is then cut the balance of the way with a separate flat dicing saw. Alternatively, the wafers may be broken along the V-shaped grooves in a manner similar to the scribe and break technique for separating LEDs. Such sawed LEDs are etched for removing saw damaged material before they are completed. Bevels may also be formed along the edges by so-called mesa etching techniques.

It may also be desirable to provide a reflector around the LED when a portion extends above the open end of the cylindrical cavity. Such an arrangement is illustrated in the drawings of FIGS. 5 and 6. In this embodiment, a LED 310 is mounted in the bottom of a cylindrical cavity 315 in a metal lead 311. A second metal lead 317 near the first lead provides a post to which a wire bond (not shown) may be connected to the front face of the LED for making electrical contact. It will be observed that such wire bonds and additional leads have been omitted from the other drawings since not needed for an understanding of this invention.

In this embodiment the cavity 315 has a depth less than the thickness of the LED. For example, the cylindrical cavity has a depth of about 220 micrometers and the LED has a thickness of about 320 micrometers. Thus the front face of the LED extends out of the cylindrical cavity about 100 micrometers. In other words, about 100 micrometers of the side faces of the LED emit light toward a concave reflective surface 318 which receives light from the side faces of the LED and projects that light in a direction generally perpendicular to the front face of the LED.

It is also found that the thickness of the epoxy potting material between the wall of a cavity and the LED chip may be larger for a chip in a very deep cavity. Thus, for example, in one embodiment illustrated in FIG. 7, a LED 410 which was 265 micrometers square was placed on a circular flat area in the bottom of a cavity 418 having a diameter of 430 micrometers in a metal lead 411. The reflective walls of the cavity were generally parabolic, extending forwardly and outwardly from the center flat area to a total diameter of 1.06 millimeters at the open end of the cavity.

The cavity was, however, quite deep, having a depth to the bottom of 675 micrometers for receiving a LED chip having a total thickness of only 255 micrometers. Thus, the depth of the front face of the LED chip below the face 419 of the metal lead forming the cavity was about 420 micrometers.

It has also been shown that effective avoidance of damaging stress is obtained in a deep cavity with an open end diameter of 1.12 millimeters, a depth of 750 micrometers, a bottom diameter of 405 micrometers, and a diameter at the front face of the LED of 985 micrometers. The chip in that cavity was also 265 micrometers square and 255 micrometers thick; that is, the height of the chip was only 34% of the cavity depth.

In another embodiment the cavity was 1.18 millimeters deep to accommodate a 255 micrometer thick LED chip, a thickness of about 22% of the cavity depth. The diameter of the open end of the cavity was 1.06 millimeters and the chip was 420 micrometers square. Again light degrading stress was not avoided.

The reason the LED chip in the bottom of a deep cavity performed satisfactorily despite a somewhat greater thickness of plastic between the side faces of the chip and the metal walls of the cavity, is not completely understood. Apparently shear stresses in the bulk plastic potting material outside of the cavity are not sufficiently coupled through the plastic potting material in the cavity to exert any substantial effect on the LED chip. Under those circumstances stresses exerted on the LED chip are primarily from the walls of the cavity and the plastic within the cavity, without substantial influence from plastic potting material outside the cavity.

It may be that the cavity dimensions should be such that a 45° line from the lip of the open end of the cavity does not intersect a side face of the LED chip in the cavity. Shear stress from plastic potting material outside the cavity should be transmitted into the cavity at an angle of no more than 45°. Thus, in such an embodiment shear stress from outside the cavity could not be transmitted to side faces of the LED chip in the bottom of a deep cavity, thereby minimizing thermal stresses on the LED chip.

In an embodiment where stress on the LED chip is minimized by placing it in a deep cavity, it is preferred that the LED chip have a height up to about forty percent of the depth of the cavity. Thus, the front face of the LED is closer to the bottom of the cavity than it is to the open end of the cavity, preferably at least sixty percent of the depth of the cavity.

Some of the reasons light output degradation is avoided may be summarized as follows. It is not necessary that all of these factors be present in a specific embodiment. The LED is mounted in a cavity so that the front face of the LED does not protrude above the face of the lead adjacent to the cavity. Preferably the face is a sufficient distance below the open end of the cavity that stresses from the plastic potting material outside the cavity are not effectively coupled into the cavity to the depth of the front face of the LED. Preferably the diameter of the cavity, at least at the front face of the LED, is less than 75 micrometers greater than the largest transverse dimension of the LED.

In an embodiment where the front face of the LED protrudes above the face of the lead adjacent to the cavity it is desirable to have the edges around the front face of the LED bevelled. Furthermore, a LED may be mounted in a cylindrical cavity with a portion adjacent to the front face protruding from the cavity with that portion surrounded by a light reflecting wall for reflecting light in a general direction perpendicular to the front face of the LED.

Rather generally speaking, it is desirable that the LED be mounted with a rather tight fit in a relatively deep cavity for effectively shielding the LED from thermal expansion stresses applied by the plastic potting material.

Although limited embodiments of improved LED mounting have been described and illustrated herein, many modifications and variations will be apparent to those skilled in the art. Thus, for example, appreciable improvement in avoiding light output degradation due to thermal stresses may be provided by mounting a LED in the bottom of a cavity which has reflective walls which are not parallel to the sides of the LED. By placing a relatively large LED chip in the bottom of such a reflective cavity, particularly if it is deep, the metal walls may still exert sufficient influence on the thermal expansion characteristics of the material surrounding the LED that light degradation occurs in a much smaller fraction of the LEDs.

In such an embodiment, beveling of the edges around the front face of the LED, using a relatively large LED, using a relatively deep cavity, and using a relatively low thermal expansion potting material may all contribute toward reducing thermal stresses and avoiding light output degradation.

The preferred cavities described hereinabove are right-circular cylinders for receiving a square LED. Other cross-sections will be apparent. Thus, for example, the cavity may be made square to fit a square LED with a somewhat larger clearance between the diagonal of the square LED and the diagonal of the square cavity than the dimensions hereinabove mentioned. Such an embodiment requires that the chips be correctly oriented when set into the cavity, whereas they may be in any desired orientation in a circular cavity. Further, LEDs of other geometries than square may be used.

Many other modifications and variations will be apparent to those skilled in the art and it is therefore to be understood that within the scope of the appended claims the invention may be practiced otherwise than as specifically described.

What is claimed is:

1. A light-emitting diode package comprising:
   a metal lead;
   a cavity having walls, a bottom and an open end in the metal lead;
   a light-emitting diode having sides and a front face in the bottom of the cavity in electrical contact with the metal lead; and
   a rigid plastic potting material between the light-emitting diode and the walls of the cavity, and
   means for minimizing light degradation of the light-emitting diode comprising a sufficiently small clearance between the sides of the light-emitting diode and the walls of the cavity that the amount of plastic potting material between the sides of the light-emitting diode and the walls is insufficient for applying light degrading stresses on the light-emitting diode due to differential thermal expansion.

2. A light-emitting diode package comprising:
   a metal lead;
   a cavity having walls, a bottom and an open end in the metal lead;

a light-emitting diode having a sides and a front face in the bottom of the cavity in electrical contact with the metal lead, a side wall of the cavity adjacent to at least the bottom of the cavity being substantially parallel to the side faces of the light-emitting diode; and a plastic potting material between the light-emitting diode and the walls of the cavity, the amount of plastic potting material being insufficient to apply light degrading stresses on the light-emitting diode due to differential thermal expansion.

3. A package as recited in claim 2 wherein a portion of the wall of the cavity is in the form of a curved reflector for projecting light from the sides of the light emitting diode in a direction generally perpendicular to the front face of the light-emitting diode.

4. A package as recited in claim 1 wherein at least a portion of the wall of the cavity is in the form of a curved reflector for projecting light from the sides of the light-emitting diode in a direction generally perpendicular to the front face of the light-emitting diode.

5. A light-emitting diode package comprising:
a metal lead;
a cavity having walls, a bottom and a open end in the metal lead;
a light-emitting diode having sides and a front face in the bottom of the cavity in electrical contact with the metal lead;
wherein the cavity is round and the diameter of the cavity is less than 75 micrometers greater than the largest transverse dimension of the light-emitting diode; and
a plastic potting material between the light-emitting diode and the walls of the cavity, the amount of plastic potting material being insufficient to apply light degrading stresses on the light-emitting diode due to differential thermal expansion.

6. A package as recited in claim 2 wherein the front face of the light-emitting diode does not protrude above a face of the lead adjacent to the open end of the cavity.

7. A package as recited in claim 1 wherein the front face of the light-emitting diode is closer to the bottom of the cavity than to a face of the lead adjacent to the open end of the cavity.

8. A light-emitting diode package comprising:
a metal lead;
a cavity having walls a bottom and a open end in the metal lead;
a light-emitting diode having sides and a front face in the bottom of the cavity in electrical contact with the metal lead; and
a rigid plastic potting material outside the cavity and between the light-emitting diode and the walls of the cavity; and
means for shielding the light-emitting diode from light degrading differential thermal expansion stresses from potting material outside the cavity comprising a sufficiently deep cavity that the front face of the light-emitting diode is a sufficient distance below the face of the lead adjacent to the cavity that stresses from plastic potting material outside the cavity are not effectively coupled into the cavity to the depth of the front face of the light-emitting diode.

9. A package as recited in claim 8 wherein the thickness of the light-emitting diode is no more than forty percent of the depth of the cavity.

10. A package as recited in claim 2 wherein edges of the light-emitting diode around the front face are beveled for relieving stress.

11. A light-emitting diode package comprising:
a metal lead;
a cavity having walls, a bottom and an open end;
a light-emitting diode having sides and a front face mounted on the metal lead;
a transparent plastic potting material surrounding the lead and light-emitting diode; and
means for effectively shielding the light-emitting diode front thermal expansion stresses applied by the plastic potting material on the light-emitting diode comprising a cavity in the lead having a wall surrounding the sides of the light-emitting diode in sufficiently close proximity to the sides of the light-emitting diode for effectively shielding the light-emitting diode from thermal expansion stresses applied by the plastic potting material on the light-emitting diode.

12. A package as recited in claim 11 wherein a side wall of the cavity is substantially parallel to the side faces of the light-emitting diode.

13. A package as recited in claim 11 wherein a portion of the wall of the cavity slopes away from the light-emitting diode for projecting light from the sides of the light-emitting diode in a direction generally perpendicular to the front face of the light-emitting diode.

14. A package as recited in claim 11 wherein the bottom of the cavity is round and the light-emitting diode is square, and wherein the diameter of the bottom of the cavity is less than 75 micrometers greater than a diagonal of the light-emitting diode.

15. A package as recited in claim 11 wherein the front face of the light-emitting diode does not protrude above the face of the lead adjacent to the open end of the cavity.

16. A package as recited in claim 15 wherein the front face of the light-emitting diode is recessed below a face of the lead adjacent to the open end of the cavity.

17. A package as recited in claim 16 wherein the front face, of the light-emitting diode is recessed below a face of the lead adjacent to the open end of the cavity at, least sixty percent of the cavity's depth.

18. A package as recited in claim 11 wherein edges of the light-emitting diode around the front face are beveled for relieving stress.

19. A light-emitting diode package comprising:
a metal lead;
a light-emitting diode having sides and a front face mounted on the metal lead;
a rigid transparent plastic potting material surrounding the lead and light-emitting diode;
a cavity have walls, a bottom and an open end in the lead; and
means for effectively shielding the light-emitting diode from thermal expansion stresses exerted by the plastic potting material outside of the cavity comprising a cavity wall extending a sufficient distance beyond the front face of the light-emitting diode for effectively shielding the light-emitting diode from thermal expansion stresses exerted by the plastic potting material outside of the cavity.

20. A package as recited in claim 19 wherein a portion of the wall of the cavity slopes away from the light-emitting diode for projecting light from the sides of the light-emitting diode in a direction generally perpendicular to the front face of the light-emitting diode.

21. A package as recited in claim 19 wherein the front face of the light-emitting diode is recessed below the face of the lead adjacent to the open end of the cavity at least sixty percent of the depth of the cavity.

22. A package as recited in claim 19 wherein the front face of the light-emitting diode is closer to the bottom of the cavity than to the face of the lead adjacent to the open end of the cavity.

23. A light emitting diode package comprising:
a metal lead;
a substantially cylindrical cavity having walls, a bottom and an open end in the metal lead;
a light-emitting diode having sides and a front face in the bottom of the cylindrical cavity in electrical contact with the metal lead, at least a major portion of the light-emitting diode being below the open end of the cavity; and
a layer of rigid transparent plastic potting material surrounding the lead and between the wall of the cylindrical cavity and the sides of the light-emitting diode, the amount of plastic potting material being insufficient to apply light degrading stresses on the light-emitting diode due to differential thermal expansion.

24. A package as recited in claim 23 further comprising a wall portion diverging away from the open end of the cavity for reflecting light from the light-emitting diode in a direction generally perpendicular to the front face of the light-emitting diode.

25. A package as recited in claim 23 wherein the cavity comprises a right circular cylinder.

26. A package as recited in claim 23 wherein the entire light-emitting diode is below the open end of the cavity.

27. A package as recited in claim 23 wherein the light-emitting junction of the light-emitting diode is below the front face of the light-emitting diode and the light-emitting diode extends beyond the open end of the cavity a distance in the same order as the distance of the junction below the front face.

28. A package as recited in claim 23 wherein the bottom of the cavity is round and the light-emitting diode is square, and wherein the diameter of the bottom of the cavity is less than 75 micrometers greater than a diagonal of the light-emitting diode.

29. A package as recited in claim 23 wherein edges of the light-emitting diode around the front face are beveled for relieving stress.

30. A light-emitting diode package comprising:
a metal lead;
a cavity having walls, a bottom and an open end in the metal lead;
a light-emitting diode having sides in the bottom of the cavity in electrical contact with the metal lead, at least a major portion of the light-emitting diode being below the open end of the cavity; and
a transparent plastic potting material surrounding the light-emitting diode in the cavity; and wherein the walls of the cavity are within no more than 75 micrometers of the sides of the light-emitting diode.

* * * * *

UNITED STATES PATENT AND TRADEMARK OFFICE
CERTIFICATE OF CORRECTION

PATENT NO. : 4,920,404

DATED : April 24, 1990

INVENTOR(S) : Dinesh C. Shrimali, Frank M. Steranka, and Cheryl L. McLeod

It is certified that error appears in the above-identified patent and that said Letters Patent is hereby corrected as shown below:

Column 2, Line 49, "the recesses ar" should read --- the recesses are ---;

Column 7, Line 22, "degrading stress was not avoided" should read --- degrading stress was avoided ---.

Signed and Sealed this

Twenty-fifth Day of June, 1991

Attest:

HARRY F. MANBECK, JR.

*Attesting Officer*  *Commissioner of Patents and Trademarks*